United States Patent
Cao et al.

(10) Patent No.: US 11,360,592 B2
(45) Date of Patent: Jun. 14, 2022

(54) DISPLAY PANEL AND METHOD OF MANUFACTURING THEREOF

(71) Applicant: Shenzhen China Star Optoelectronics Semiconductor Display Technology Co., Ltd., Shenzhen (CN)

(72) Inventors: Wu Cao, Shenzhen (CN); Yunglun Lin, Shenzhen (CN); Liwei Gong, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 188 days.

(21) Appl. No.: 16/652,693

(22) PCT Filed: Mar. 20, 2020

(86) PCT No.: PCT/CN2020/080395
§ 371 (c)(1),
(2) Date: Apr. 1, 2020

(87) PCT Pub. No.: WO2021/168946
PCT Pub. Date: Sep. 2, 2021

(65) Prior Publication Data
US 2022/0027004 A1    Jan. 27, 2022

(30) Foreign Application Priority Data

Feb. 25, 2020  (CN) .......................... 202010116873

(51) Int. Cl.
*G06F 3/041*    (2006.01)
*G02F 1/1333*   (2006.01)
(Continued)

(52) U.S. Cl.
CPC ........ *G06F 3/0412* (2013.01); *G02F 1/13338* (2013.01); *G02F 1/13394* (2013.01);
(Continued)

(58) Field of Classification Search
None
See application file for complete search history.

(56) References Cited

U.S. PATENT DOCUMENTS

| 2011/0037713 | A1* | 2/2011 | Chen ..................... G06F 3/0446 |
| | | | 345/173 |
| 2017/0192277 | A1* | 7/2017 | Gong .................. G02F 1/13394 |

(Continued)

FOREIGN PATENT DOCUMENTS

| CN | 102109695 | 6/2011 |
| CN | 203232406 | 10/2013 |

(Continued)

*Primary Examiner* — Ryan Crockett

(57) ABSTRACT

A display panel and a method of manufacturing thereof are provided. The display panel includes a backlight module, a first substrate and a second substrate opposite to each other, a plurality of touch signal traces disposed on the first substrate, a common electrode layer and a plurality of touch electrodes disposed on the second substrate, and a plurality of conductive primary spacers disposed between the first substrate and the second substrate. Two ends of the conductive primary spacers are connected to the touch electrodes and the touch signal traces, to avoid the shielding of the touch electrode signals by the common electrode.

14 Claims, 6 Drawing Sheets

(51) Int. Cl.
  *G02F 1/1335*  (2006.01)
  *G02F 1/1339*  (2006.01)
  *H01L 27/12*  (2006.01)
  *G06F 3/044*  (2006.01)

(52) U.S. Cl.
  CPC ...... *G02F 1/133514* (2013.01); *H01L 27/124* (2013.01); *G06F 3/0443* (2019.05); *G06F 2203/04103* (2013.01)

(56) References Cited

U.S. PATENT DOCUMENTS

| | | | |
|---|---|---|---|
| 2017/0276985 A1* | 9/2017 | Jia | G02F 1/133345 |
| 2018/0095316 A1* | 4/2018 | Park | G02F 1/133345 |
| 2018/0120607 A1* | 5/2018 | Li | G02F 1/13338 |
| 2019/0018271 A1* | 1/2019 | Xie | G02F 1/13439 |
| 2019/0079617 A1* | 3/2019 | Li | G02F 1/13394 |
| 2021/0041733 A1* | 2/2021 | Al | G02F 1/136209 |

FOREIGN PATENT DOCUMENTS

| | | |
|---|---|---|
| CN | 104461208 | 3/2015 |
| CN | 105116585 | 12/2015 |
| CN | 105404040 | 3/2016 |
| CN | 107329625 | 11/2017 |
| CN | 109062444 | 12/2018 |
| CN | 110634804 | 12/2019 |

* cited by examiner

DISPLAY PANEL AND METHOD OF MANUFACTURING THEREOF

RELATED APPLICATIONS

This application is a National Phase of PCT Patent Application No. PCT/CN2020/080395 having International filing date of Mar. 20, 2020, which claims the benefit of priority of Chinese Patent Application No. 202010116873.4 filed on Feb. 25, 2020. The contents of the above applications are all incorporated by reference as if fully set forth herein in their entirety.

FIELD AND BACKGROUND OF THE INVENTION

The present disclosure relates to the field of display technology, and more particularly, to a display panel and a method of manufacturing thereof.

A in-cell touch structure is compatible with current liquid crystal panel manufacturing process and may improve thickness of liquid crystal panel modules. As for liquid crystal panels with negative dielectric anisotropy liquid crystals, a common electrode layer needs to be disposed on a side of a substrate close to a backlight module to avoid that touch electrode signals are shield by the common electrode layer. Meanwhile, in order to prevent a large number of touch electrodes on a top substrate and a bottom substrate from being conductively connected by gold glue dots at the peripheral of non-display area, traces of the touch electrodes and pixels need to be disposed an array substrate.

However, the array substrate has to be disposed on a side of the color filter substrate away from the backlight module. High reflectance caused by a large amount of metal electrodes on the array substrate reduces light transmittance of the backlight module, so brightness of the display panel is decreased. In addition, in order to avoid crosstalk coupling effect between the touch electrodes and the pixel electrodes, it is necessary to cover the touch electrodes with an organic layer as an insulating layer, which makes the subsequent high-temperature processes for thin film transistors more difficult.

Accordingly, the touch structure of the current liquid crystal box in the display panel having a high reflectance caused by a large amount of the metal electrodes in the array substrate reduces the light transmittance of the backlight module, so the brightness of the display panel is decreased. Therefore, it is necessary to provide a display panel and a method of manufacturing the display panel to solve this problem.

SUMMARY OF THE INVENTION

A display panel and a method of manufacturing the display panel are provided to the problem that a in-cell touch structure of the display panel having a high reflectance caused by a large amount of the metal electrodes in the array substrate reduces the light transmittance of the backlight module, which reduces the brightness of the display panel.

A display panel comprises a backlight module, a first substrate and a second substrate opposite to each other, a liquid crystal layer disposed between the first substrate and the second substrate, a pixel electrode layer, a plurality touch signal traces, a common electrode layer, a plurality of touch electrodes, and a plurality of conductive primary spacers. The backlight module is disposed on a side of the first substrate away from the second substrate. The pixel electrode layer and the plurality of touch signal traces are disposed on a side of the first substrate close to the second substrate. The common electrode layer is disposed on a side of the second substrate close to the first substrate, and the plurality of touch electrodes are disposed between the common electrode layer and the second substrate. The plurality of conductive primary spacers are disposed between the first substrate and the second substrate, and two ends of the plurality of conductive primary spacers are connected to the plurality of touch electrodes and the plurality of touch signal traces.

In one embodiment, the plurality of touch electrodes are arranged on the second substrate along a first direction and a second direction to form a touch electrode array.

In one embodiment, the plurality of touch electrodes are bulk electrodes, and a size of each of the touch electrodes ranges from 3*3 mm to 10*10 mm.

In one embodiment, each of the touch electrodes is connected to at least one of the conductive primary spacers.

In one embodiment, the display panel further comprises a plurality of light transmission regions and a plurality of non-light transmission regions. A plurality of black matrixes are disposed on a side of the second substrate close to the first substrate, and the plurality of black matrixes and the plurality of the conductive primary spacers are disposed in the non-light transmission regions.

In one embodiment, a plurality of auxiliary spacers are disposed on a side of the first substrate close to the second substrate, the plurality of auxiliary spacers are disposed in the non-light transmissive regions, and the auxiliary spacers and the conductive primary spacers are made of a same material.

In one embodiment, a first insulating layer is disposed between the common electrode layer and the touch electrode, and the conductive primary spacer is connected to the touch electrode through penetrating the common electrode layer and a via hole of the first insulating layer.

In one embodiment, the display panel further comprises a color filter layer. The color filter layer is disposed on a side of the first substrate close to the second substrate, or the color filter layer is disposed on a side of the second substrate close to the first substrate.

In one embodiment, the display panel further comprises a plurality of thin film transistors disposed on a side of the first substrate close to the second substrate. The thin film transistor comprises a gate, an active layer, a source, and a drain, and the touch signal trace, the source, and the drain are made of a same material and are disposed in a same layer.

A display panel comprises a backlight module, a first substrate and a second substrate opposite to each other, a liquid crystal layer disposed between the first substrate and the second substrate, a color filter, a common electrode layer, a first insulating layer, a plurality of touch electrodes, and a plurality of conductive primary spacers. The backlight module is disposed on a side of the first substrate away from the second substrate. A pixel electrode layer and a plurality of touch signal traces are disposed on a side of the first substrate close to the second substrate. The color filter layer, the common electrode layer, the first insulating layer, and the plurality of touch electrodes are disposed on a side of the second substrate close to the first substrate, the color filter layer is disposed between the second substrate and the first insulating layer, the common electrode is disposed on a side of the first insulating layer away from the substrate, and the plurality of touch electrodes are disposed between the color filter layer and the first insulating layer. The plurality of conductive primary spacers are disposed between the first substrate and the second substrate, one end of the plurality of conductive primary spacers is connected to the plurality of touch electrodes, and another end of the plurality of conductive primary spacers penetrates through the common electrode layer and a via hole of the first insulating layer to connect the plurality of touch electrodes.

In one embodiment, the plurality of touch electrodes are arranged on the second substrate along a first direction and a second direction to form a touch electrode array.

In one embodiment, the plurality of touch electrodes are bulk electrodes, and a size of each of the touch electrodes ranges from 3*3 mm to 10*10 mm.

In one embodiment, each of the touch electrodes is connected to at least one of the conductive primary spacers.

In one embodiment, the display panel further comprises a plurality of light transmission regions and a plurality of non-light transmission regions. A plurality of black matrixes are disposed on a side of the second substrate close to the first substrate, and the plurality of black matrixes and the plurality of the conductive primary spacers are disposed in the non-light transmission region.

In one embodiment, a plurality of auxiliary spacers are disposed on a side of the first substrate close to the second substrate, the plurality of auxiliary spacers are disposed in the non-light transmissive regions, and the auxiliary spacers and the conductive primary spacers are made of a same material.

In one embodiment, the display panel further comprises a plurality of thin film transistors disposed on a side of the first substrate close to the second substrate. The thin film transistor comprises a gate, an active layer, a source, and a drain, and the touch signal trace, the source, and the drain are made of a same material and are disposed in a same layer.

A method of manufacturing a display panel comprises following steps of: providing a first substrate; depositing a first metal layer on the first substrate; etching the first metal layer to form a gate; forming a gate insulating layer on the first substrate; forming an active layer on the gate insulating layer; depositing a second metal layer on the gate insulating layer; etching the second metal layer to form a source, a drain, and a touch signal trace; forming a pixel electrode layer on a side of the first substrate close to the second substrate; forming a plurality of conductive primary spacers on a side of the first substrate close to the second substrate; providing a second substrate; depositing a third metal layer on the second substrate; etching the third metal layer to form a touch electrode; forming a first insulating layer on the second substrate, wherein the first insulating layer covers the touch electrode; forming a common electrode layer on a side of the first insulating layer away from the second substrate; etching the common electrode layer and the first insulating layer to form a via hole exposing a part of the touch electrode; and attaching the first substrate to the second substrate.

The present disclosure has beneficial effects described herein. The pixel electrodes and the touch signal traces are disposed on the first substrate, and touch electrodes and common electrodes are disposed on the second substrate. A plurality of conductive primary spacers are disposed between the first substrate and the second substrate so that the touch electrodes connect to the touch signal traces to realize the conduction between the first substrate and the second substrate. Therefore, touch electrode signals shielded by the common electrode is avoided, and a backlight module is disposed on a side of the first substrate away from the second substrate to increase the light transmittance of the backlight module and the brightness of the display panel.

BRIEF DESCRIPTION OF THE SEVERAL VIEWS OF THE DRAWINGS

In order to more clearly illustrate the technical solutions in the embodiments, the drawings described in the description of the embodiments are briefly described below. It is obvious that the drawings in the following description are only some embodiments of the present disclosure. Other drawings can also be obtained from those skilled persons in the art based on drawings without any creative effort.

DESCRIPTION OF SPECIFIC EMBODIMENTS OF THE INVENTION

The following descriptions of the embodiments are made with reference to additional illustrations to illustrate specific embodiments of the disclosure. Directional terms mentioned in this application, such as "up," "down," "forward," "backward," "left," "right," "inside," "outside," "side," etc., are merely indicated the direction of the drawings. Therefore, the directional terms are used for illustrating and understanding of the disclosure rather than limiting thereof.

Figure 1:
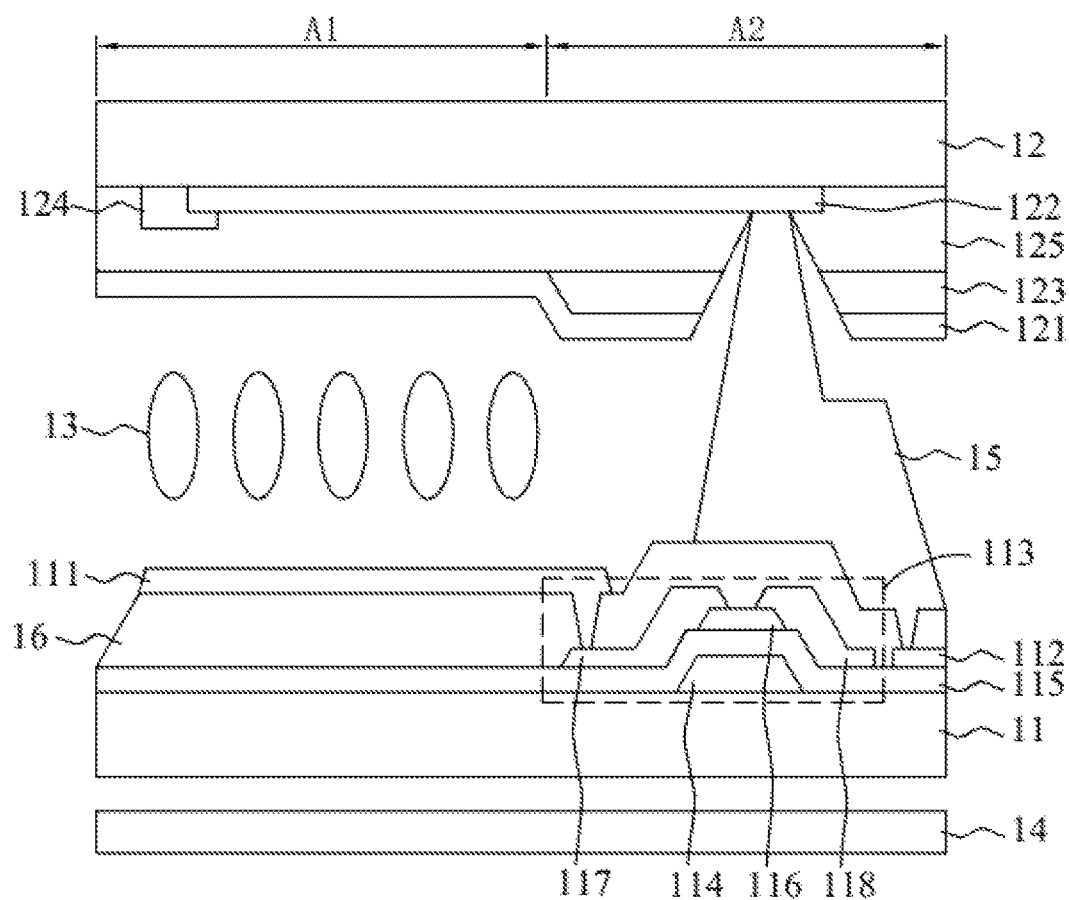
FIG. 1 is a schematic cross-sectional view of a display panel according to one embodiment of the present disclosure.

The disclosure is further described below with reference to the drawings and specific embodiments. A display panel is provided, and the display panel is described in detail with reference to FIG. 1 to FIG. 6. Referring to FIG. 1, it is a schematic cross-sectional view of a display panel according to one embodiment of the present disclosure. The display panel is a liquid crystal display panel with negative dielectric anisotropy liquid crystals, and the liquid crystal display panel includes an in-cell touch structure. The display panel comprises a backlight module 14, a first substrate 11 and a second substrate 12 opposite to each other, a liquid crystal layer 13 disposed between the first substrate 11 and the second substrate 12. The backlight module 14 is disposed on a side of the first substrate 11 away from the second substrate 12.

A pixel electrode layer 111 and a plurality of touch signal traces 112 are disposed on a side of the first substrate 11 close to the second substrate 12. The pixel electrode layer 111 comprises a patterned pixel electrode formed by etching. A common electrode layer 121 is disposed on a side of the second substrate 12 close to the first substrate 11, and a plurality of touch electrodes 122 are disposed between the common electrode layer 121 and the second substrate 12.

Referring to FIG. 1, a plurality of conductive primary spacers 15 are disposed between the first substrate 11 and the second substrate 12, and two ends of the plurality of conductive primary spacers 15 are connected to the plurality of touch electrodes 122 and the plurality of touch signal traces 112. The first substrate 11 and the second substrate 12 are conductively connected by gold glue dots, so as to avoid forming gold glue dots at the peripheral of non-display area around the first substrate 11 and the second substrate 12, thereby reducing related processes, required materials, and production costs.

Specifically, the conductive primary spacer 15 is made of an organic polymer photoresist containing conductive particles. The conductive particles comprise metal micro/nano particles such as Au/Ag/Pt, nano-silver wires (AgNW), graphene, or carbon nanotubes.

Figure 2:
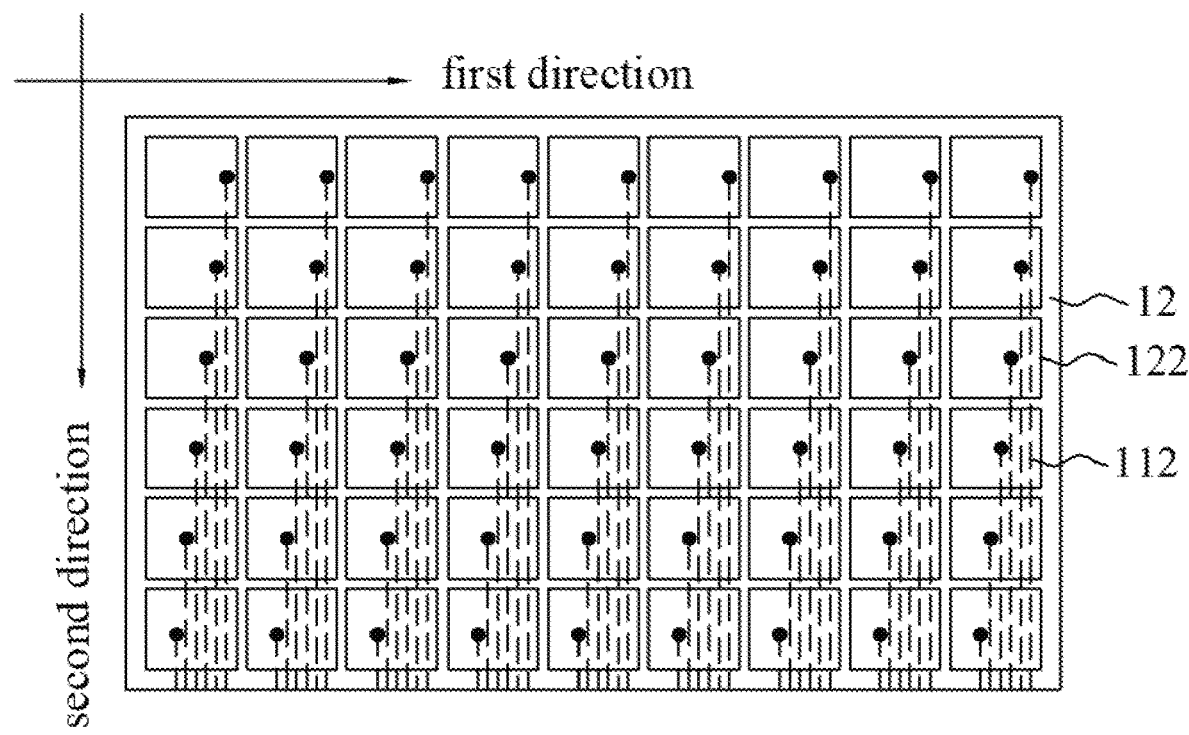
FIG. 2 is a schematic view of an arrangement of touch electrodes according to one embodiment of the present disclosure.

Referring to FIG. 2, it is a schematic view of an arrangement of touch electrodes according to one embodiment of the present disclosure. The display panel has a transmissive self-capacitance touch screen. The plurality of touch electrodes 122 are arranged on the second substrate 12 along a first direction and a second direction to form a touch electrode array. The touch electrodes 122 are connected to the touch signal traces 112 through the conductive primary spacers 15.

The touch electrode array and ground form a capacitor. When a finger touches the display panel, a capacitance of the finger is added to the capacitor, which increases the capacitance of the capacitor. The coordinates of the first and second directions of the touch point may be determined based on the change of the capacitance before or after touching, so as to confirm coordinates of the touch point.

Specifically, the plurality of touch electrodes 122 are bulk electrodes, and a size of each of the touch electrodes 122 is 5*5 mm. Of course, the size of the each of the touch electrode 122 is not limited to 5*5 mm, and it may range from 3*3 mm and 10*10 mm to meet the precise touch function. The specific value may be set according to actual needs, and it is not limited herein. In addition, in order to ensure the light transmittance of the display panel, the material of the touch electrode 122 is a transparent metal oxide, such as indium tin oxide (ITO).

Figure 3:
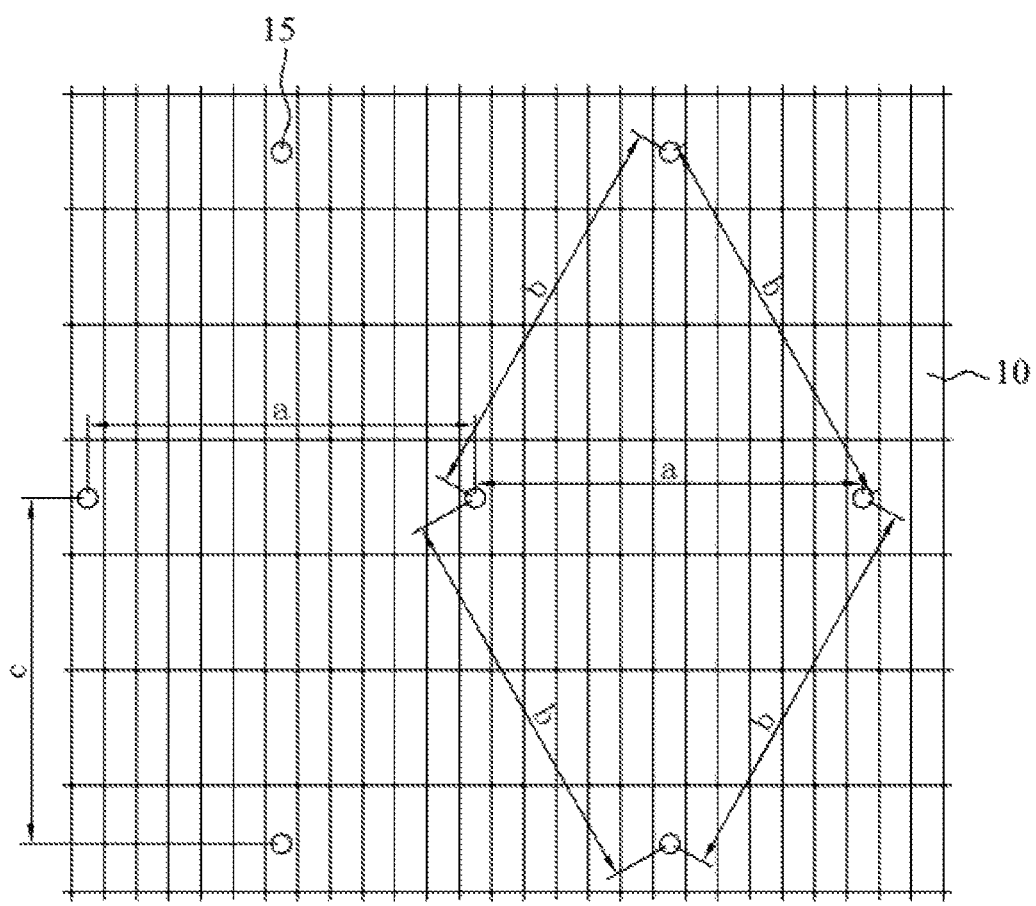
FIG. 3 is a schematic view of an arrangement of primary conductive spacers according to one embodiment of the present disclosure.

Referring to FIG. 1 to FIG. 3, FIG. 3 is a schematic view of an arrangement of primary conductive spacers according to one embodiment of the present disclosure. The display panel comprises a plurality of sub-pixels 10 arranged in an array, and each of the sub-pixels 10 comprises a light-transmission region A1 and a non-light transmission region A2. A plurality of black matrixes 123 are disposed on a side of the second substrate 12 close to the first substrate 11, and the black matrixes 123 and the conductive primary spacers 15 are disposed in the non-light transmission region A2 to block light from the adjacent light-transmission region A1.

Each of touch electrodes merely needs to correspond to one conductive primary spacer 15 so as to achieve conductively connection with the touch signal traces 112. As shown in FIG. 3, the conductive primary spacer 15 may be regularly arranged on the second substrate 12 based on a specific density. The plurality of conductive primary conductive spacers 15 in the same column of sub-pixels 10 are arranged at equal intervals, and the conductive primary spacers 15 in any two adjacent columns are arranged in a staggered manner.

Specifically, a distance of "a" between any two adjacent conductive primary spacers 15 in the same column of sub-pixels 10 is 1488 μm. A straight-line distance between the conductive primary spacers 15 in any column and the conductive primary spacers in the adjacent row is equal to a distance along the second direction between the conductive primary spacers 15 in any column and the conductive primary spacers in the adjacent row. The straight-line distance of "b" is 1341 μm, and the distance of "c" along the second direction is 1116 μm. That is, two adjacent conductive primary spacers in one column and two conductive primary spacers in the upper and lower columns are disposed in a diamond-shaped arrangement. The uniformly arranged conductive primary spacers 15 may not only connect the touch electrodes 122 to the touch signal traces 112, but also make the thickness of the liquid crystal layer of the display panel remain the same. In addition, the liquid crystal display panel has been tested in some special environments, and it plays a role in improving the performance of the display panel.

Of course, in some embodiments, the conductive primary spacers may also be arranged according to other specific densities. The above-mentioned distance may also be changed based on actual needs. The adjacent conductive primary spacers may also be arranged in a square matrix or other arbitrary shape arrangements, which achieves the same technical effect as the above embodiment and is not limited herein.

Preferably, each touch electrode only needs to correspond to one conductive spacer 15 to achieve conductively connection with the touch signal traces 112. However, in order to avoid the contact resistance between the touch electrode 122 and the conductive primary spacer 15 is increased due to the small contact area, one touch electrode 122 should be connected to the plurality of conductive primary spacers 15 to reduce the impedance. In addition, the risk of touch failure caused by a single conductive primary spacer 15 or the touch signal trace 112 being disconnected may be avoided.

Figure 4:
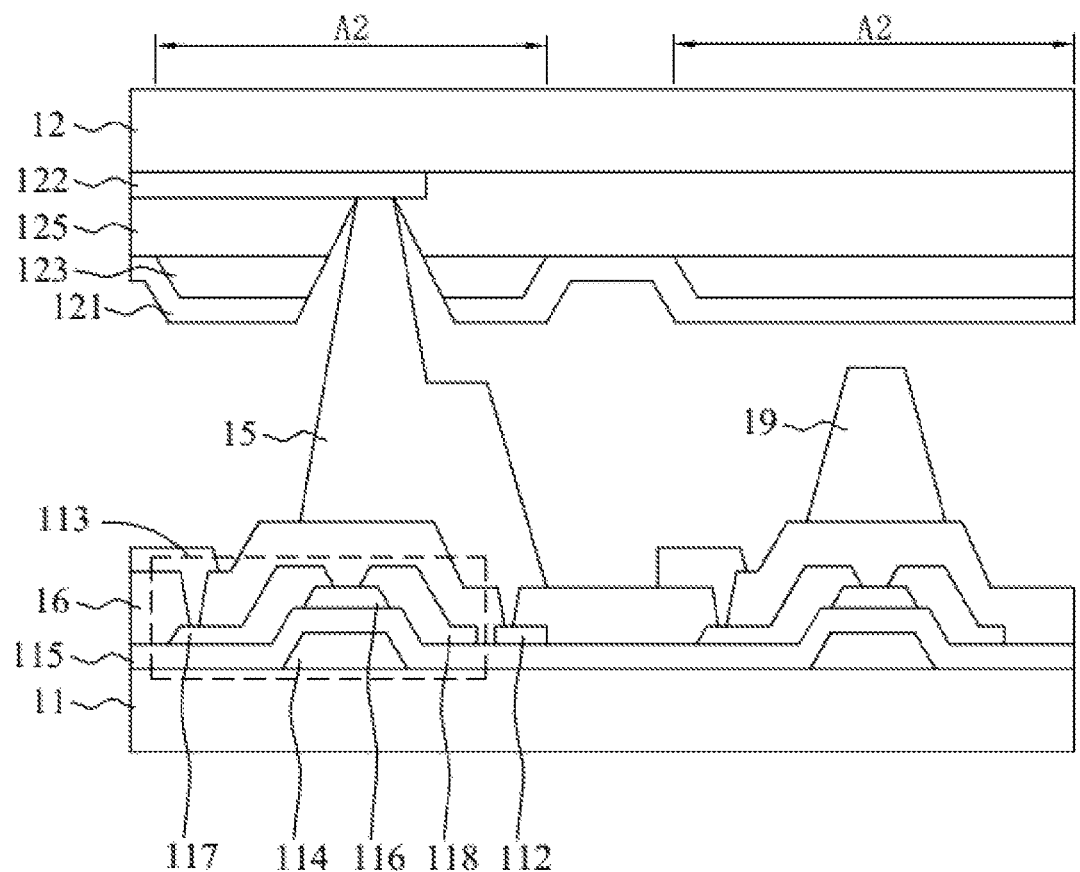
FIG. 4 is a schematic view of an auxiliary spacer according to one embodiment of the present disclosure.

Referring to FIG. 4, it is a schematic view of an auxiliary spacer according to one embodiment of the present disclosure. A plurality of auxiliary spacers 19 are disposed on a side of the first substrate 11 close to the second substrate 12, and the plurality of auxiliary spacers 19 are disposed on a side of the color filter layer 16 away the first substrate 11 in the non-light transmissive regions A2. A height of the auxiliary spacer 19 is lower than a height of the conductive primary spacer 15. The auxiliary spacer 19 is used to support the first substrate 11 and the second substrate 12 so as to maintain the thickness of each liquid crystal layer in the display panel. In addition, the auxiliary spacer 19 may be selected from materials commonly used in the prior art. Of course, the auxiliary spacer 19 is preferable be selected from a material that is the same with the conductive primary spacer 15 having organic polymer photoresist containing conductive particles, so that the conductive primary spacer 15 and the auxiliary spacer 19 may be formed at the same time through a process, which may reduce steps of production process, improve production efficiency, and reduce production costs.

In the embodiment of the present disclosure, the common electrode layer 121 is formed by vapor deposition on the entire surface. A first insulating layer 125 is disposed between the common electrode layer 121 and the touch electrode 122 to insulate the common electrode layer 121 from the touch electrode 122, and thus it avoids crosstalk coupling effect between the common electrode layer 121 and the touch electrode 122.

Specifically, the material of the first insulating layer 125 is SiNx. Of course, in some embodiments, the material of the insulating layer 125 may also be an inorganic material such as SiOx, or may be an organic material such as a polymer material like PFA, and it is not limited herein.

A plurality of thin film transistors 113 are also disposed on a side of the first substrate 11 close to the second substrate 12, and the plurality of thin film transistors 113 are disposed in the non-light transmissive regions A2. The thin film transistor 113 comprises a gate 114, an active layer 116, a source 117, and a drain 118. A gate insulating layer 115 is disposed on the first substrate 11, and the gate insulating layer 115 covers the gate 114. The active layer 116 is disposed on a side of the gate insulating layer 115 away from the first substrate 11. The source 117 and the drain 118 are connected to both sides of the active layer 116.

In the embodiment, the touch signal trace 112, the source 17, and the drain 118 are made of a same material, and all of them are disposed on a side of the gate insulating layer 115 away from the first substrate 11. Specifically, the gate 114 is formed by etching the first metal layer in the display panel, and the source 117, the drain 118, and the touch signal trace 112 are formed by etching the second metal layer, thereby reducing the number of photomask used for forming the touch signal trace by individual etching and related layers. In addition, the touch signal trace 112 is disposed on the first substrate 11 while the first touch signal trace 124 connected to the touch electrode on the second substrate is retained, and a structure including two touch signal traces in one sub-pixel may be formed. Of course, in some embodiments, the first touch signal trace 124 disposed on the second substrate may also be omitted, and only the touch signal trace 112 is needed to realize the transmission of touch signals.

In the embodiment of the present disclosure, the display panel is a display panel with a color film on array (COA). The first substrate 11 is an array substrate, and the display panel comprises a color filter layer 16 disposed on a side of the first substrate 11 close to the second substrate 12.

Specifically, the color filter layer 16 is disposed on a side of the gate insulating layer 115 away from the first substrate 11 and covers the thin film transistor 113. The pixel electrode layer 111 is disposed on a side of the color filter layer 16 away from the first substrate 11 and is connected to the source 117 of the thin film transistor 113 through a via hole penetrating through the color filter layer. The conductive primary spacer 15 is connected to the touch signal trace 112 through another via hole penetrating through the color filter layer. The black matrix 123 is disposed between the first insulating layer 125 and the common electrode layer 121. One end of the conductive primary spacer 15 is connected to the touch electrode 122 through the via hole penetrating through the common electrode layer 121, the black matrix 123, and the first insulating layer 125. Therefore, the array substrate may be disposed on a side close to the backlight module 14 so as to reduce the reflection of the light emitted from the backlight module 14 by metal layers on the first substrate 11, and the light transmittance and the brightness of the display panel are improved. At the same time, the touch electrode 122 and the common electrode layer 121 disposed on the second substrate may be compatible with the manufacturing process of the in-cell display panel without affecting the pixel electrode layer 111, and it does not need to develop a new manufacturing process, thereby reducing production costs.

In another embodiment, a display panel is provided. The structure of the display panel is substantially the same as the structure of the display panel described above. The difference is that the display panel provided by this embodiment is a Non-COA display panel. That is, the color filter layer 16 is disposed on a side of the second substrate 12 close to the first substrate 11. The first substrate 11 is an array substrate, and the second substrate 12 is a color filter substrate.

Figure 5:
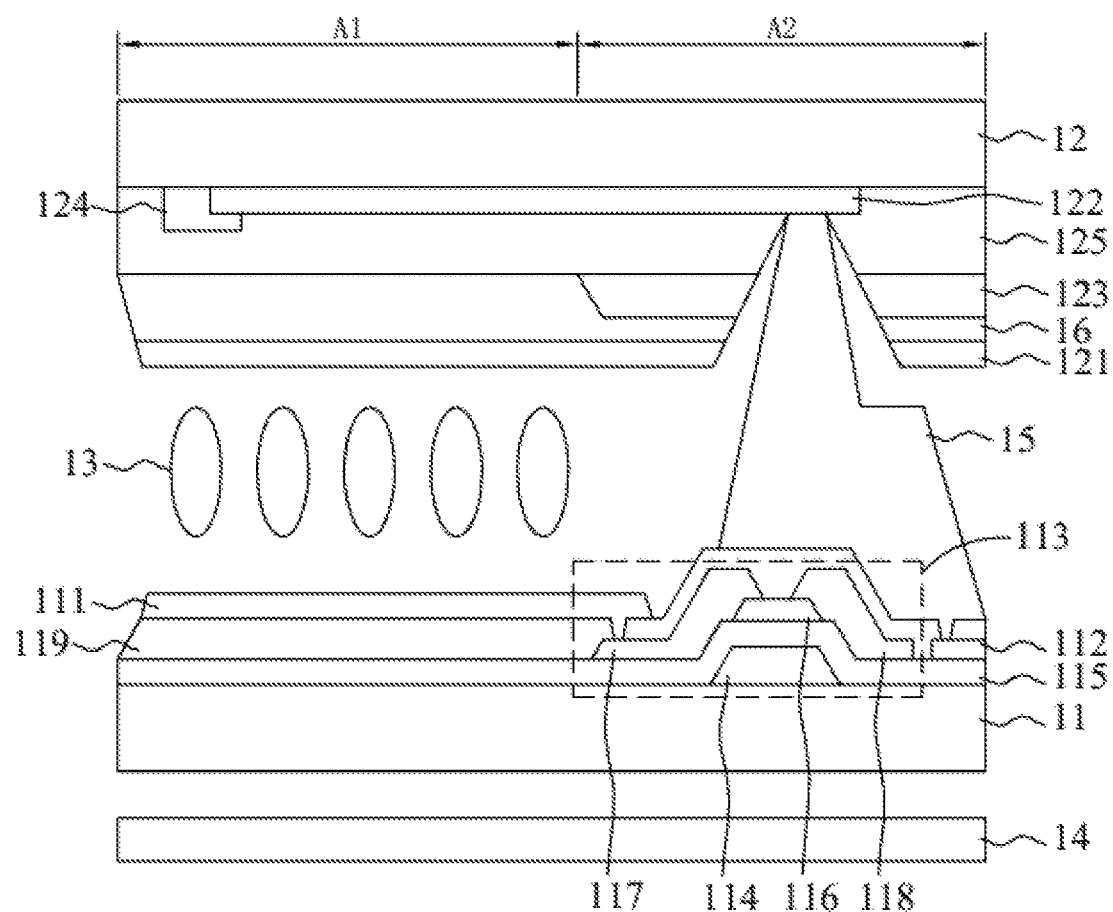
FIG. 5 is a schematic cross-sectional view of a second display panel according to one embodiment of the disclosure.

Referring to FIG. 5, it is a schematic cross-sectional view of a second display panel according to one embodiment of the disclosure. The color filter layer 16 and the black matrix 123 are disposed between the first insulating layer 125 and the common electrode layer 121. A second insulating layer 119 is disposed on a side of the gate insulating layer 115 away from the first substrate 11. The second insulating layer 119 also covers the thin film transistor 113. The pixel electrode 111 is connected to a source 117 through a via hole formed on the second insulating layer 119. The conductive primary spacer 15 is connected to the touch signal trace 112 through another via hole formed on the second insulating layer 119. The other end of conductive primary spacer 15 is connected to the touch electrode 122 through a via hole penetrating through the common electrode layer 121, the color filter layer 16, the black matrix 123, and the first insulating layer 125.

Figure 6:
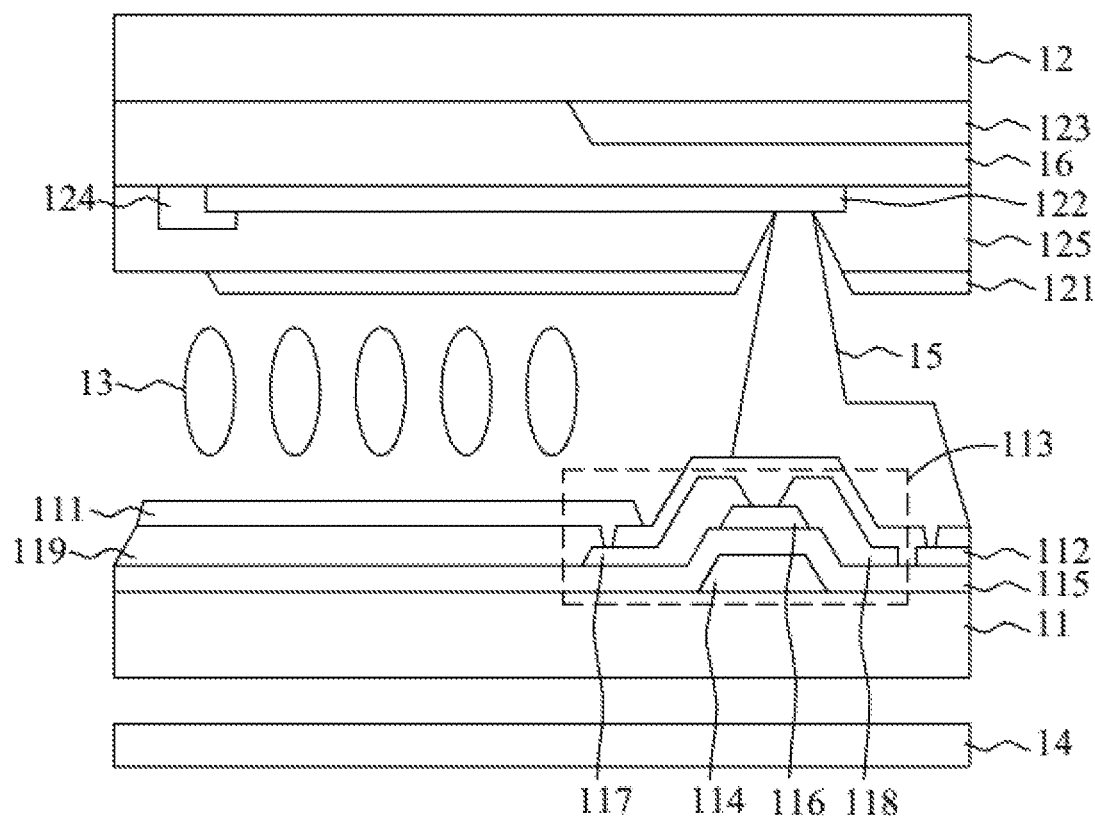
FIG. 6 is a schematic cross-sectional view of a third display panel according to one embodiment of the disclosure.

In further embodiment, a display panel is provided. The structure of the display panel is substantially the same as the above-mentioned display panels. Referring to FIG. 6, it is a schematic cross-sectional view of a third display panel according to one embodiment of the disclosure. The difference is that the color filter layer 16 and the black matrix 123 are disposed between the first insulating layer 125 and the second substrate 12. The touch electrode 122 is disposed between the color filter layer 16 and the first insulating layer 125. One end of the conductive primary spacer 15 is connected to the touch signal trace 112, and the other end is connected to the touch electrode 122 through a via hole penetrating through the common electrode layer 121 and the first insulating layer 125.

As for the second display panel, it is needed to form via holes on the color filter layer 16, the black matrix 123, the first insulating layer 125, and the common electrode layer 121. As compared to the third display panel, the depth of the via hole of the second display panel is significantly increased, and the height of the required conductive primary spacer 15 is also increased accordingly. Therefore, the difficulty of assembling the first substrate 11 and the second substrate 12 is increased, and the risk of assembly deviation is also increased. As for the third display panel, it does not need to form via holes on the color filter layer 16 and the black matrix 123, and the height of the required conductive primary spacer 15 is less than the above-mentioned conductive primary spacer. Therefore, the difficulty of assembling is reduced, and the cost and the difficulty of assembly are controllable, and the third display panel is preferred.

The present disclosure has beneficial effects described herein. The pixel electrodes and the touch signal traces are disposed on the first substrate, and touch electrodes and common electrodes are disposed on the second substrate. A plurality of conductive primary spacers are disposed between the first substrate and the second substrate so that the touch electrodes connect to the touch signal traces to realize the conduction between the first substrate and the second substrate. Therefore, touch electrode signals shielded by the common electrode is avoided, and a backlight module is disposed on a side of the first substrate away from the second substrate to increase the light transmittance of the backlight module and the brightness of the display panel.

Referring to FIG. 1 to FIG. 6, a method of manufacturing a display panel is provided. The method of manufacturing a display panel comprises steps as follows.

Step S1: providing a first substrate 11, depositing a first metal layer on the first substrate 11, and etching the first metal layer to form a gate 114.

Step S2: forming a gate insulating layer 115 on the first substrate, and the gate insulating layer 115 covers the gate 114, and forming an active layer 116 on the gate insulating layer 115.

Step S3: depositing a second metal layer on the gate insulating layer 115, etching the second metal layer to form a source 117, a drain 118, and a touch signal trace 112.

Step S4: forming a pixel electrode layer 111 on a side of the first substrate 11 close to the second substrate 12.

Step S5: forming a plurality of conductive primary spacers 15 on a side of the first substrate 11 close to the second substrate 12, and one end of the conductive primary spacer 15 is connected to the touch signal trace 112.

Step 6: providing a second substrate 12, depositing a third metal layer on the second substrate 12, and etching the third metal layer to form a plurality of touch electrodes 122.

Step S7, forming a first insulating layer 125 on the second substrate 12, and the first insulating layer 125 covers the touch electrode 122.

Step S8, forming a common electrode layer on a side of the first insulating layer 125 away from the second substrate 12, and etching the common electrode layer and the first insulating layer to form a via hole exposing a part of the touch electrode.

Step S9, attaching the first substrate 11 to the second substrate 12, so the other end of conductive primary spacer 15 is connected to the touch electrode 122.

In the embodiment of the present disclosure, the display panel manufactured by the manufacturing method is a liquid crystal display panel with a color film on array (COA) as shown in FIG. 1. The color filter layer 16 is disposed on the first substrate 11, and the first substrate 11 is an array substrate. Therefore, the following steps should be included between steps S3 and S4.

Step S31: forming a color filter layer 16 on the gate insulating layer 115.

Step S32: etching the color filter layer 16 to form a plurality of via holes penetrating through the color filter layer 16.

After steps S4 and S5, the pixel electrode may be connected to the source 117 through the above-mentioned via holes, and the conductive primary spacer 15 may be connected to the touch signal trace 112 through the via holes, thereby conductively connecting the first substrate 11 and the second substrate 12. Therefore, it may avoid forming gold glue dots at the peripheral of non-display area around the first substrate 11 and the second substrate 12, and related processes, required materials, and production costs are reduced.

In this embodiment, in step S3, the source 117, the drain 118, and the touch signal trace 112 are formed by etching the second metal layer, and the touch signal trace 112 is formed in the manufacturing process of the source and drain. In this way, and the photomask and related processes required for forming the touch signal trace by etching may be reduced, so the production efficiency is improved, and the production cost is reduced.

The display panel having an in-cell touch structure is manufactured in the embodiment, the first substrate 11, which the array substrate, is disposed on a side close to the backlight module 14, and it reduces the reflection of the light emitted from the backlight module 14 by metal layers on the first substrate 11, and the light transmittance and the brightness of the display panel are improved.

In this embodiment, in the step S5, while the conductive primary spacer 15 is formed, a plurality of auxiliary spacers 19 are formed. A height of the plurality of auxiliary spacers 19 are less than a height of the conductive primary spacer 15. The auxiliary spacer 19 and the conductive primary spacer 15 are made of the same materials. The auxiliary spacer 19 may effectively maintain the thickness of liquid crystal layer.

The Non-COA display panels as shown in FIG. 5 and FIG. 6 are also manufactured by this method. The difference is that the color filter layer 16 is disposed on a side of the second substrate 12 close to the first substrate 11. The color filter layer 16 is disposed between the first insulating layer 125 and the common electrode layer 121. At this time, the via hole formed in step S8 also needs to penetrate through the color filter layer 16 and the black matrix 123. Also, the color filter layer 16 is disposed between the first insulating layer 125 and the second substrate 12. At this time, the via hole formed in step S8 does not need to penetrate through the first insulating layer 125 and the black matrix 123, which may effectively reduce the depth of the via hole and the height of conductive primary spacer 15, thereby reducing the difficulty of attaching the first substrate 11 to the second substrate 12.

The present disclosure has beneficial effects described herein. The touch signal traces and pixel electrodes are disposed on the second substrate and the first substrate. The touch electrodes are connected to the touch signal traces through the conductive primary spacers. Therefore, touch electrode signals shielded by the common electrode is avoided, and a backlight module is disposed on a side of the first substrate away from the second substrate to increase the light transmittance of the backlight module and the brightness of the display panel.

In the above, the present application has been described in the above preferred embodiments, but the preferred embodiments are not intended to limit the scope of the disclosure, and a person skilled in the art may make various modifications without departing from the spirit and scope of the application. The scope of the present application is determined by claims.

What is claimed is:

1. A display panel, comprising:
    a backlight module;
    a first substrate and a second substrate opposite to each other;
    a liquid crystal layer disposed between the first substrate and the second substrate;
    a pixel electrode layer;
    a plurality touch signal traces;
    a common electrode layer;
    a plurality of touch electrodes; and
    a plurality of conductive primary spacers;
    wherein the backlight module is disposed on a side of the first substrate away from the second substrate;
    wherein the pixel electrode layer and the plurality of touch signal traces are disposed on a side of the first substrate close to the second substrate;
    wherein the common electrode layer is disposed on a side of the second substrate close to the first substrate, and the plurality of touch electrodes are disposed between the common electrode layer and the second substrate;
    wherein the plurality of conductive primary spacers are disposed between the first substrate and the second substrate, and two ends of the plurality of conductive primary spacers are connected to the plurality of touch electrodes and the plurality of touch signal traces;
    wherein the plurality of touch electrodes are arranged on the second substrate along a first direction and a second direction to form a touch electrode array;
    wherein the display panel further comprises a plurality of light transmission regions and a plurality of non-light transmission regions, wherein a plurality of black matrixes are disposed on a side of the second substrate close to the first substrate, and the plurality of black matrixes and the plurality of the conductive primary spacers are disposed in the non-light transmission regions; and a first insulating layer is disposed between the common electrode layer and the touch electrode, and the conductive primary spacer is connected to the touch electrode through penetrating the common electrode layer and a via hole of the first insulating layer.

2. The display panel according to claim 1, wherein the plurality of touch electrodes are bulk electrodes, and a size of each of the touch electrodes ranges from 3*3 mm to 10*10 mm.

3. The display panel according to claim 1, wherein each of the touch electrodes is connected to at least one of the conductive primary spacers.

4. The display panel according to claim 1, wherein a plurality of auxiliary spacers are disposed on a side of the first substrate close to the second substrate, the plurality of auxiliary spacers are disposed in the non-light transmissive regions, and the auxiliary spacers and the conductive primary spacers are made of a same material.

5. The display panel according to claim 1, further comprising a color filter layer, wherein the color filter layer is disposed on a side of the first substrate close to the second substrate, or the color filter layer is disposed on a side of the second substrate close to the first substrate.

6. The display panel according to claim 1, further comprising a plurality of thin film transistors disposed on a side of the first substrate close to the second substrate, wherein the thin film transistor comprises a gate, an active layer, a source, and a drain, and the touch signal trace, the source, and the drain are made of a same material and are disposed in a same layer.

7. A display panel, comprising:
   a backlight module;
   a first substrate and a second substrate opposite to each other;
   a liquid crystal layer disposed between the first substrate and the second substrate;
   a color filter;
   a common electrode layer;
   a first insulating layer;
   a plurality of touch electrodes; and
   a plurality of conductive primary spacers;
   wherein the backlight module is disposed on a side of the first substrate away from the second substrate;
   wherein a pixel electrode layer and a plurality of touch signal traces are disposed on a side of the first substrate close to the second substrate;
   wherein the color filter layer, the common electrode layer, the first insulating layer, and the plurality of touch electrodes are disposed on a side of the second substrate close to the first substrate, the color filter layer is disposed between the second substrate and the first insulating layer, the common electrode is disposed on a side of the first insulating layer away from the substrate, and the plurality of touch electrodes are disposed between the color filter layer and the first insulating layer; and
   wherein the plurality of conductive primary spacers are disposed between the first substrate and the second substrate, one end of the plurality of conductive primary spacers is connected to the plurality of touch electrodes, and another end of the plurality of conductive primary spacers penetrates through the common electrode layer and a via hole of the first insulating layer to connect the plurality of touch electrodes.

8. The display panel according to claim 7, wherein the plurality of touch electrodes are arranged on the second substrate along a first direction and a second direction to form a touch electrode array.

9. The display panel according to claim 8, wherein the plurality of touch electrodes are bulk electrodes, and a size of each of the touch electrodes ranges from 3*3 mm to 10*10 mm.

10. The display panel according to claim 8, wherein each of the touch electrodes is connected to at least one of the conductive primary spacers.

11. The display panel according to claim 8, further comprising a plurality of light transmission regions and a plurality of non-light transmission regions, wherein a plurality of black matrixes are disposed on a side of the second substrate close to the first substrate, and the plurality of black matrixes and the plurality of the conductive primary spacers are disposed in the non-light transmission region.

12. The display panel according to claim 11, wherein a plurality of auxiliary spacers are disposed on a side of the first substrate close to the second substrate, the plurality of auxiliary spacers are disposed in the non-light transmissive regions, and the auxiliary spacers and the conductive primary spacers are made of a same material.

13. The display panel according to claim 7, further comprising a plurality of thin film transistors disposed on a side of the first substrate close to the second substrate, wherein the thin film transistor comprises a gate, an active layer, a source, and a drain, and the touch signal trace, the source, and the drain are made of a same material and are disposed in a same layer.

14. A method of manufacturing a display panel, comprising following steps of:
   providing a first substrate;
   depositing a first metal layer on the first substrate;
   etching the first metal layer to form a gate;
   forming a gate insulating layer on the first substrate;
   forming an active layer on the gate insulating layer;
   depositing a second metal layer on the gate insulating layer;
   etching the second metal layer to form a source, a drain, and a touch signal trace;
   forming a pixel electrode layer on a side of the first substrate close to the second substrate;
   forming a plurality of conductive primary spacers on a side of the first substrate close to the second substrate;
   providing a second substrate;
   depositing a third metal layer on the second substrate;
   etching the third metal layer to form a touch electrode;
   forming a first insulating layer on the second substrate, wherein the first insulating layer covers the touch electrode;
   forming a common electrode layer on a side of the first insulating layer away from the second substrate;
   etching the common electrode layer and the first insulating layer to form a via hole exposing a part of the touch electrode;
   connecting one end of the conductive primary spacers to the touch signal trace through the via hole;
   connecting each of the conductive primary spacers to the touch electrode; and
   attaching the first substrate to the second substrate.

* * * * *